United States Patent
Liu (10) Patent No.: US 6,482,476 B1
(45) Date of Patent: Nov. 19, 2002

(54) LOW TEMPERATURE PLASMA ENHANCED CVD CERAMIC COATING PROCESS FOR METAL, ALLOY AND CERAMIC MATERIALS

(75) Inventor: Shengzhong Frank Liu, 6084 Pond Place Way, Mechanicsville, VA (US) 23111

(73) Assignee: Shengzhong Frank Liu, Mechanicsville, VA (US)

( * ) Notice: Subject to any disclaimer, the term of this patent is extended or adjusted under 35 U.S.C. 154(b) by 0 days.

(21) Appl. No.: 09/465,405

(22) Filed: Dec. 16, 1999

Related U.S. Application Data (63) Continuation-in-part of application No. 08/947,528, filed on Oct. 6, 1997, now abandoned.

(51) Int. Cl.[7] .............................................. C23C 16/30
(52) U.S. Cl. ...................... 427/535; 427/576; 427/577; 427/585; 427/255.18; 427/255.31; 427/255.38; 427/255.394
(58) Field of Search .............................. 427/535, 576, 427/577, 585, 255.394, 255.31, 255.38, 255.18

(56) References Cited

U.S. PATENT DOCUMENTS 5,707,705 A * 1/1998 Nelson et al.
5,876,808 A * 3/1999 Hall et al.
6,110,571 A * 8/2000 Yaginuma et al.

FOREIGN PATENT DOCUMENTS

JP          07-216548       *  8/1995

OTHER PUBLICATIONS

Musher et al., J. Mater. Res., vol. 11, No. 4, Apr., 1996, pp. 989–1001.*

* cited by examiner

*Primary Examiner*—Timothy Meeks (57) ABSTRACT

A low temperature, high growth rate plasma enhanced chemical vapor deposition process is demonstrated for ceramic coatings on metal, alloy and ceramic substrates. The deposition process is carried out at low temperatures (<350-degC.) to prevent the bulk substrate properties from being adversely affected. The substrates are treated with gas surface hardening processes before deposition. Bonding strength (adhesion) between the coating and the substrate is improved by combining surface heat treating processes with the coating processes. Hard ceramic-solid lubricant composite coatings are used for fuel injector components, hydraulic valve components, and other wear parts. Metal-releasing agents are used to improve deposition efficiency. Electron cyclotron resonance mechanism and electromagnetic radiation are used to improve bonding strength, growth rate, coating uniformity, film smoothness and other film qualities.

9 Claims, 5 Drawing Sheets

LOW TEMPERATURE PLASMA ENHANCED CVD CERAMIC COATING PROCESS FOR METAL, ALLOY AND CERAMIC MATERIALS

CROSS-REFERENCE TO RELATED APPLICATION(S)

This is a continuation-in-part of commonly-owned, copending U.S. patent application Ser. No. 08/947,528, filed Oct. 6, 1997 now abandoned.

BACKGROUND OF THE INVENTION

Thanks to their superior mechanical properties such as hardness, low coefficient of friction, thermal stability at high temperature, oxidation resistance, inertness to most common chemicals, and electrical and optical properties, ceramic materials are technologically important materials for many applications, especially for high temperature, high power, electronic barrier coatings, and cutting tool applications. For example, tungsten carbide (WC) including WC-Co alloys, silicon nitride, aluminum oxide, silicon oxide, titanium nitride, and titanium carbide are all very popular materials in the market, particularly in machining business.

As used herein, a "cerarnics material" includes nitrides, oxides, borides, sulfides, carbides, suicides, carbon, hydrogenated carbon materials and the like.

For example, titanium nitride has been exceptionally popular among other ceramic materials. Due to its beautiful golden color, it has been widely used for decoration and marketing purposes. It is also very hard—1770 kg/mm2, stable in air at temperature as high as 650-degC. It is relatively corrosion- and wear-resistant with relatively low friction coefficient, making it very popular in cutting tool industry. Various high temperature PVD and CVD titanium nitride coated cutting/machine tools (such as inserts, drills, saws, punches, dies, molds, pins, knifes), fuel injector components are currently available in the commercial markets. In fact, most of the above components are made of high speed tool steel. The material itself is expensive relative to lower grade steel materials. Taken diesel fuel injector components as an example, the diesel fuel injection operation is carried out at very high pressure, normally at about 150,000 psi (pounds per square inch) for diesel fuel engine. The injection is also carried out at very high speed and in very short cycle time. The excessive failures are resulted due to fatigue from repeated impact, extensive wear and erosion caused by abrasive particles. In order to prolong the life of the fuel injectors, high speed tool steel is commonly used, with extensive post-treatments, including heat treating which increases hardness; tempering to relieve stresses and restore toughness; surface nitriding; and finally coating with titanium nitride. The entire post treatment costs approximately three times as much as the combined cost for material and fabrication process (including finish grounding). The titanium nitride coating alone costs almost half of the total components. The key for cost-reduction is to lower post-treatment cost, especially coating cost.

NITRIDING, CARBURIZING, AND CARBONITRIDING

There are basically two major kinds of nitriding methods: gas phase nitriding and liquid bath nitriding. In the gas phase nitriding process, nitrogen-containing gases, mostly ammonia or nitrogen are used. Under high temperature or high energy radiation, e.g. DC electric, RF radiation, ammonia or nitrogen are dissociated into nitrogen atoms. The highly energetic and active nitrogen atoms reacts with metal surface and diffused into the subsurface to form metal-nitrides.

If hydrocarbon is also introduced along with nitrogen and/or ammonia, the process is then called carbonitriding or nitrocarburizing. In the like manner, surface carburizing is performed with hydrocarbon containing gases.

The other method uses liquid bath—actually a molten nitrogen-containing salt bath. The molten salt reacts with the metal surface to form nitrides, carbides, and oxides.

These nitriding, carburizing and carbonitriding processes may form up to millimeter deep nitride, carbide material over extended period of time.

HEAT TREATMENT OF METAL AND ALLOY MATERIALS

In general, heat treatment refers to a defined process which heats and cools a solid metal or alloy in a controlled manner in order to improve specific properties, such as hardness, strength, ductility, magnetic susceptibility, toughness, machinability, fabricability, and even corrosion resistance. According to this definition, heat treating has long been practiced since ancient metalsmith or blacksmith made bronze tools and iron-based swords. Metals are still heat treated today, for the same reasons as ancient days— namely, to enhance or maximize mechanical properties of the materials. Optimizing hardness, strength, and other mechanical characteristics by heat treating techniques remains as primary interest of many equipment designers. Depends on composition and nature of the materials to be treated and their applications, heat treating may include austenitizing, quench hardening, annealing, tempering, normalizing, austempering, stress reliving, precipitation hardening, sintering, as well as surface enhancement techniques which utilizes thermochemical treatment such as carburizing, carbonitriding, nitriding, nitrocarburizing, etc.

COMMON PRACTICES FOR CRITICAL APPLICATIONS

For applications involving extensive wear, the most common practices today are to chose high grade (relatively expensive) steel as starting material, for example, high speed tool steel which offers better mechanical properties such as a good combination of hardness and toughness. After the components are machined to desired size, shape and surface finish, heat treatment is carried out to harden and temper the parts. In most cases, quench hardening may increase hardness of the treated part significantly, however, it makes the part brittle. Tempering is therefore necessary to increase toughness of the material, however, it sacrifices the hardness. It is difficult to balance between toughness and hardness because a part treated for maximum toughness is often too soft, whereas the same part treated for maximum hardness becomes too brittle. Surface nitriding is therefore employed to further improve the hardness and wear-resistance. Due to the increasing safety and environmental concerns, gas nitriding and plasma nitriding have been widely used today. In the plasma nitriding process, nitrogen-containing gas (nitrogen, ammonia) is dissociated and ionized. The nitrogen ions bombard metal surface, react and diffuse into the subsurface to form nitrided layer. The high energy plasma used in plasma nitriding (or ionitriding) also reduces substrate temperature.

After nitriding, a thin film of titanium nitride is often further applied to increase the hardness of the components. Since current titanium nitride coating techniques require high temperature, all problems associated with this technique, as described in the previous sections, become inevitable.

For certain applications such as machining, ceramic materials are often employed by utilizing the hardness of ceramic materials. For example, tungsten carbide based cutting inserts, drills, dies, and so on are gaining popularity. However, ceramic materials are very difficult to machine. Materials such as tungsten carbide often lack good tribological quality. Therefore, a layer of tribological coating such as TiN or composites would improve wear related performance.

These and other limitations of the prior art methods are addressed by the techniques of the present invention, which do not depend on a high grade material, which do not require fill range of heat treatment, which do not require high temperature and which do not adversely affect mechanical properties of the base materials.

TITANIUM NITRIDE COATING AND TECHNIQUES

The most popular process for titanium nitride coating is PVD method, as described in previous section. Its major limitations include (1) high substrate temperature which anneals substrate and causes dimension change and distortion; (2) complicated equipment and control operation; (3) extended preheating and cooling period; (4) long cycle time; and (5) coating-substrate adhesion is not as good as the coating produced with high temperature CVD method.

Chemical vapor deposition (CVD) has also been developed, though it is not as popular as PVD. A comprehensive review may be found in (F.S. Galasso, Chemical Vapor Deposited Materials, CRC press, FL, (1991)).

Although Musher and Gordon ("Atmospheric pressure chemical vapor deposition of TiN from tetrakis (dimethylamido) titanium and ammonia", J. N. Musher and R. G. Gordon, J. Mater. Res., 11 (4), 989–1001, (1996).) have recently demonstrated a low temperature CVD process to produce titanium nitride films on glass and silicon substrates at low temperature (190–420-degC.), the growth rate was only 25 Å/min (25 Angstroms per minute) at 190-degC. (degrees Celsius) to 150 Å/min at 420-degC., much too lower for mechanical applications, not to mention that the nitrogen/titanium ratios in the deposited films were significantly substoichiometric (N/Ti<0.6–0.75). In a paper titled "The influence of ammonia on rapid-thermal low-pressure metalorganic chemical vapor deposited TiNx films from tetrakis (dimethylamido) titanium precursor onto InP", (A. Katz, et al. J. Appl. Phys. 71 (2), 993–1000 (1992).) Katz et al. demonstrated a CVD process with improved growth rate of 1000 Å/min on InP substrate at 300-degC.–350-degC. temperature range, however, (A. Weber, et al. J. Electrochem. Soc. 141 (3), 849 (1994).) Webe et al. also found that high growth rates led to poor quality films. Moreover, all above CVD processes were directed to semiconductor applications on Si or InP semiconductor substrates, coating-substrate adhesion was never a part of their concerns.

In summary, low temperature CVD titanium nitride coating processes have been demonstrated on semiconductor substrates. However, the growth rates are generally low, quality and adhesion are too poor to be practical for wear-related applications.

Moreover, no low temperature CVD titanium nitride process has been demonstrated on metal, alloy or ceramic substrates, such as steels, tungsten carbide based ceramics, etc.

Development of low temperature PVD processes has been attempted, one of the major problems is that adhesion between the coating and the substrate is too weak for wear-related applications

CURRENT PVD COATING TECHNOLOGY

Presently, the TiN coating is mostly based on Physical Vapor Deposition (PVD) techniques. It introduces titanium atoms and ions from a solid titanium target surface using sputtering techniques. The titanium atoms and ions subsequently react with nitrogen-containing plasma. TiN is then deposited onto substrates, e.g. fuel injector components, which are in contact with the plasma. A more detailed process procedures include:

(1) load substrates into vacuum reactor;
(2) evacuate the reactor, using at least two pump stages (one foreline pump and one diffusion pump), to a base pressure of about 10-6 Torr;
(3) preheat the substrate to a desired temperature, normally 1100 F.;
(4) clean the substrate surface with plasma (normally hydrogen plasmas);
(5) initiate the nitrogen-containing plasma to start sputtering and deposition; and
(6) after deposition, the coated components need to be sufficiently cooled before venting the reactor to unload the components.

DRAWBACKS OF CURRENT PVD TECHNOLOGY

Current PVD titanium nitride coating processes require complicated and expensive equipment. The process also demands high precision and many parameters need to be strictly controlled. The substrate needs to be very clean, free of oil and water, otherwise, it would be difficult to pump to the ultra-high vacuum required. The high substrate temperature (about 1100 F.) required (to ensure a good bonding between the TiN coating and the steel substrate) is detrimental to the hardened steel substrates. It actually softens the already hardened steel and may change substrate dimensions at least in certain extent over the long deposition period. The deposition cycle is very long, normally around six hours for a 1–2 micron thick coating. It is not capable for thick coating, due to stress, it cannot make thick coatings such as 20 microns. It has very narrow parameter space, little pressure deviation would result in different phases of coating material. The high coating temperature makes it take long time to cool from 500-degC. to 200-degC. though you may cool it faster from 200-degC. to room temperature. The process also produces and exhausts safety and environmental hazards such as hydrogen, ammonia, etc. In addition, PVD is more difficult to control quality; requires more complicated equipment and control operation; extended preheating and cooling period hence long cycle time; and coating-substrate adhesion is not as good as the coating produced with high temperature CVD method in general.

CURRENT HIGH TEMPERATURE CVD COATING TECHNOLOGY

Although it is not as popular as PVD, high temperature Chemical Vapor Deposition (CVD) has long been developed. As a matter of fact, CVD titanium nitride coating was developed earlier than its peer PVD process. However, CVD titanium nitride coating process was basically replaced by the corresponding PVD process because its following shortcomings:

(1) The CVD processes used TiCl4 as titanium precursor gas. Since titanium–chlorine bonds are very strong, high deposition temperature is required to dissociate the TiCl4 to form titanium nitride coating.

(2) Chlorine is always found in the film, deteriorating film quality.

(3) Chlorine and hydrochloric formed cause corrosion to the system and hazards to the environment.

CURRENT STATUS OF LOW TEMPERATURE PVD AND CVD TECHNOLOGIES

Recently, low temperature CVD titanium nitride coating processes have been demonstrated on semiconductor substrates. Because they were intended for semiconductor application, the growth rates are generally low, quality and adhesion are too poor to be practical for wear-related mechanical applications. Moreover, no low temperature CVD titanium nitride process has been demonstrated on metal or alloy substrates, let alone steel.

TiN coating has also been demonstrated with low temperature PVD process, however, lower temperature sacrifices adhesion between the coating and the substrate, film quality and deposition rate.

TECHNICAL OBJECTIVES, LONG FELT NEED

Based on above analyses, it is evident that the key for cost-reduction is to lower post-treatment cost, especially TiN coating cost. A low temperature, high growth rate process would reduce cycle time, preserve toughness and other properties of core substrate materials, therefore would cut cost. Meanwhile, the enhanced adhesion and smoother surface would improve performance of fuel injector components. Therefore basic objectives of the invention may be summarized as follows:

1. Producing TiN coating at low temperature (<350-degC.);
2. Smoother surface hence lower friction coefficient;
3. Enhanced adhesion;
4. Faster growth rate (6 micron/hour).

In addition, the high speed tool steel material itself is expensive relative to lower grade steel materials. Substitution of the tool steel material with lower grade, cheaper materials will further reduce cost.

Limitations of the prior art methods, as described in previous sections, are addressed by the present invention. Firstly, it does not require high temperature as other processes, therefore it does not adversely affect mechanical properties of the base materials. Secondly, smoother, more uniform coating produced by the present invention provides lower friction, enhanced adhesion characteristics, resulting in better performance. Thirdly, cycle time is reduced significantly due to the faster growth, elimination of loading, evacuation, substrate preheating and cleaning, as well as shorter cooling time. Additionally, the present inventive process is not sensitive to process parameters such as flow rates, pressure, temperature, etc. making it more controllable, reliable and reproducible. Another advantage is that potentially, more economic substrate material may be used to replace the current high speed steel, further cutting material cost. All these lead to lower production cost and better reliability. Finally, the present invention combines titanium nitride coating process with the existing plasma nitriding process, therefore, no additional equipment investment is necessary.

DEFINITIONS

Metal-releasing agent: A metal-releasing agent is a metal-containing compound or complex in which chemical bonds around the metal atom(s) or group(s) are very weak and can be easily broken or dissociated so that metal atoms or desired metal-containing groups are released easily. Most of metal-releasing agents may be found among metal hydrides and organometallic compounds or complexes.

Nitrogen-releasing agents: A nitrogen-releasing agent is a nitrogen-containing compound or complex in which chemical bonds around the nitrogen atom(s) are very weak and can be easily broken or dissociated to form active nitrogen-containing species. Some materials may release both titanium and nitrogen simultaneously (as a leaving group).

Plasma assisting gas: A plasma assisting gas is a gas which assists initiation, stabilization of the plasma. It also assists activation (including dissociation and ionization) of precursor materials. Plasma assisting gases are usually inert gases in the group VIIIA consisting of helium, neon, argon, krypton, xenon.

Reactive gas: A reactive gas is a gas that participates chemical reactions during deposition processes. For example, in titanium nitride deposition processes, nitrogen, hydrogen or ammonia may be used as reactive gases.

Substrate: A substrate is a component, a part or a device to be coated. For example, fuel injector components in this proposal are considered as substrates.

Titanium-releasing agents: A titanium-releasing agent is a titanium-containing compound or complex in which chemical bonds around the titanium atom(s) are very weak and can be easily broken or dissociated to form active titanium-containing species. Most of titanium-releasing agents may be found among metal hydrides and organometallic compounds or complexes.

Prior Art References

Attention is directed to the following U.S. Pat. Nos. 5,288,543; 5,707,705; 5,399,379; 5,165,804; 5,312,529; 5,523,124; and 5,135,775.

Attention is directed to the following publications, discussed hereinabove:

1. Raaijmakers, et al. in Advanced Metallization and Processing for Semiconductor Devices and Circuits II, edited by A. Katz, et al. (Mater. Res. Soc. Symp. Proc. 260, Pittsburgh, Pa., 1993), p.99.

2. Tsai, et al. in Advanced Metallization and Processing for Semiconductor Devices and Circuits II, edited by A. Katz, et al. (Mater. Res. Soc. Symp. Proc. 260, Pittsburgh, Pa., 1993), p.793.

3. Chiang, et al. in Advanced Metallization and Processing for Semiconductor Devices and Circuits II, edited by A. Katz, et al. (Mater. Res. Soc. Symp. Proc. 260, Pittsburgh, Pa., 1993), p.813.

4. "Atmospheric pressure chemical vapor deposition of TiN from tetrakis(dimethylamido) titanium and ammonia", J. N. Musher and R. G. Gordon, J. Mater. Res., 11 (4), 989–1001, (1996).

5. "The influence of ammonia on rapid-thermal low-pressure metalorganic chemical vapor deposited $TiN_x$ films from tetrakis (dimethyamido) titanium precursor onto InP", Katz, et al. J. Appl. Phys. 71 (2), 993–10000 (1992).

6. Weber, et al. J. Electrochem. Soc. 141 (3), 849 (1994).

7. F. S. Galasso, Chemical Vapor Deposited Materials, CRC press, FL, (1991).

SUMMARY OF THE INVENTION

Based on above analyses, it is evident that industries have immediate needs to develop a process, material or coating to make metal or alloy surface hard, tough, wear-resistant. The processes are desired to operate at low temperatures (<350-degC.) so that bulk properties are not adversely affected.

It is therefore an object of the present invention to provide an improved technique for fabricating a hard, wear-resistant ceramic coating on metal, alloy and ceramic surfaces without affecting bulk metal properties, especially core toughness, adversely.

It is another object of the present invention to provide a surface coating on metals, alloys and ceramics with improved toughness.

It is another object of the present invention to provide a surface coating that reduces friction.

It is another object of the present invention to provide a surface coating on metals, alloys and ceramics with enhanced corrosion and erosion characteristics.

It is another object of the present invention to provide a technique for high growth rate (>1 micron/hour, preferably about 10 micron/hour) ceramic film deposition and strong coating-substrate bonding.

It is another object of the present invention to provide a low temperature technique for fabricating nitride ceramics at low temperature (preferably under 250-degC.) and high growth rate (>1 micron/hour, preferably about 10 micron/hour) by using metal-releasing agents as precursors. The nitrides are preferably titanium nitride, silicon nitride, boron nitrides, aluminum nitride, carbon nitride, hafnium nitride, tantalum nitride, zirconium nitride, and other metal nitrides, etc.

It is another object of the present invention to provide a technique for fabricating oxide ceramics with CVD method at low temperature (preferably under 250-degC.) and high growth rate (>1 micron/hour, preferably about 10 micron/hour) by using metal-releasing agents as precursors. The oxides are preferably aluminum oxide, silicon monoxide, silicon dioxide, titanium oxide, zirconium oxide, tungsten oxide, molybdenum oxide, and other metal oxides, etc.

It is another object of the present invention to provide a technique for fabricating carbide ceramics with CVD method at low temperature (preferably under 250-degC.) and high growth rate (>1 micron/hour, preferably about 10 micron/hour) by using metal-releasing agents as precursors. The carbides are preferably aluminum carbide, silicon carbide, titanium carbide, zirconium carbide, boron carbide, hafnium carbide, molybdenum carbide, tungsten carbide, tantalum carbide, and other metal carbides, etc.

It is another object of the present invention to provide a technique for fabricating boride ceramics with CVD method at low temperature (preferably under 250-degC.) and high growth rate (>1 micron/hour, preferably about 10 micron/hour) by using organic boranes and metal-releasing agent as precursors. The borides are preferably titanium boride, zirconium boride, hafnium boride, molybdenum boride, tungsten boride, tantalum boride, and other metal borides, etc.

It is another object of the present invention to provide a technique for fabricating silicide ceramics with CVD method at low temperature (preferably under 250-degC.) and high growth rate (>1 micron/hour, preferably about 10 micron/hour) by using silanes and metal-releasing agents as precursors. The silicides are preferably titanium silicide, zirconium silicide, hafnium silicide, molybdenum silicide, tungsten silicide, tantalum silicide, and other metal silicides, etc.

It is another object of the present invention to provide a technique for fabricating complex/composite ceramics with CVD method at low temperature (preferably under 250-degC.) and high growth rate (>1 micron/hour, preferably about 10 micron/hour) by using metal-releasing agents as precursors. Examples of the complex/composite ceramics include titanium aluminum nitrides, titanium carbonitride, mixture of nitrides and carbides, layer by layer structures (e.g. one layer carbide over another layer of nitride), mixture of at least two ceramic materials including nitrides, carbides, borides, oxides, suicides, sulfides, and carbon, hydrogenated carbon materials, etc.

It is another object of the present invention to provide a technique for fabricating wear resistant and tribological coatings on fuel injector, hydraulic valve components, machine tools (e.g. cutting inserts, drills, mills, punches, dies, saws, molds, pins, knifes, cutters, etc.) at temperatures lower than 500-degC., preferably lower than 250-degC. with good bonding strength or adhesion. The coatings may include the above nitrides, carbides, oxides, borides, carbon, hydrogenated carbon materials, fluorides and sulfides based lubricants and their composites.

It is another object of the present invention to provide a technique for fabricating low friction-coefficient coatings (<0.15, and preferably smaller than 0.1 or even lower, without lubrication against steel) on fuel injector components, hydraulic components and machine tools. The coating materials may be selected from the group of the above nitrides, carbides, borides, oxides, intermetallics, lubricants such as $MoS_2$, $WS_2$, fluorides, carbon, polymers.

It is another object of the present invention to provide a technique for fabricating hard coatings on fuel injector components, hydraulic components, machine tools, etc. The hard coating (equivalent to >70, preferably >80 on Rockwell "C" scale) may include the above ceramics, carbon, hydrogenated carbon materials, and so on.

It is another object of the present invention to provide a technique for fabricating polymer-containing materials on fuel injector components, hydraulic components and machine tools. The polymeric materials are preferably polytetrafluoroethylene (PTFE, DuPont Teflon S), polyphenylene, polyethelene, polyurethane, polycarbonate, ABS, polyimides, polyamides, polystyrene, poly-perfluoroalkoxy (PFA), poly-ethylene tetrafluoroethelene (ETFE), Fluorinated poly-ethylene propylene (FEP), other fluoropolymers, and the like.

It is another object of the present invention to provide a technique for fabricating dry lubricant-containing films for the fuel injector components, hydraulic components and machine tools. The lubricants may include metal-sulfides, (e.g. WS2 and MoS2), carbon, hydrogenated carbon, BN, or the like. The lubricants may also be composites of the above materials with metals or ceramics.

It is another object of the present invention to provide a technique for fabricating composite coatings of hard ceramic material and above lubricant materials with low friction coefficients on fuel injector components, hydraulic components and machine tools. The lubricant materials are preferably selected from the group of metal sulfides (e.g. tungsten disulfide, molybdenum disulfide), carbon (e.g. graphite, glassy carbon, amorphous carbon, etc.), hydrogenated carbon, boron nitride, polymeric materials including polytetrafluoroethylene (PTFE, DuPont Teflon S), polystyrene, polyurethane, polycarbonate, ABS, polyimides, polyamides, polyphenylene, polyethelene, polystyrene, Teflon, polyimide, polyamide, poly-perfluoroalkoxy (PFA), poly-ethylene tetrafluoroethelene (ETFE), Fluorinated ethylene propylene (FEP), fluoropolymers and so on.

It is another object of the present invention to reduce material cost by fabricating fuel injector components, hydraulic valve components, machine tools and other wear parts with lower grade, less expensive materials. A suitable coating is applied on their surfaces to improve performance.

It is another object of the present invention to eliminate part or entire heat treating procedures. For example, one may coat components directly after fabrication and finishing. In the case of fuel injector components, after they are machined to size, shape and finish, coating, e.g. titanium nitride, may be directly applied without extensive heat treating, at least part of it.

It is another object of the present invention to provide a technique for applying wear-resistant coating on fuel injector components, hydraulic components and machine tools with thermal spray techniques, either in vacuum or in atmosphere. The material may be a composite of ceramic or metallic material and lubricants.

It is another object of the present invention to provide a one-step surface modification by combining the surface heat treatment process with CVD coating process. For example, titanium nitride coating may be applied with nitriding or carbonitriding equipment and process upon introducing metal-containing material. Carbon, and hydrogenated carbon coating may also be applied with carburizing or nitrocarburizing equipment and processes. Silicon carbide may be fabricated with carburizing equipment and process upon adding silane. Metal carbides may be fabricated with carburizing equipment and process upon adding metal-containing material.

It is another object of the present invention to provide a technique to improve bonding between the coating and the substrate by combining surface heat treating processes such as nitriding, carburizing and carbonitriding with coating processes. For example, freshly nitrided surface has a better bonding with nitride coatings. Freshly carburized surface has a better bonding with carbon-containing coatings. Freshly siliconised surface has a better bonding with silicon-containing coatings. Freshly boronised surface has a better bonding with boron-containing coatings.

It is another object of the present invention to provide better metal-releasing agents as precursors for CVD ceramic coatings.

It is another object of the present invention to provide a technique for fabricating nanoscale coatings with better wear-resistant properties.

It is another object of the present invention to provide a technique and precursor systems to fabricate metal-containing coatings at low temperature, preferably lower than 250-degC.

It is another object of the present invention to provide a technique to improve coating growth rate and to increase adhesion between the coating and the substrates. For example, electromagnetic radiation may be used to radiate substrate surface during the process so as to promote ionization, activation, growth rate, bonding. The radiation may be ultraviolet or infrared rays.

According to the invention, the said deposition is carried out at low temperature so that the base material would not be thermally affected or mechanically weakened. Moreover, the lower temperature required would significantly reduce preheating, cooling time and therefore total cycle time.

According to the invention, metal-releasing agents are used as precursors. The precursors, together with reactive gas(es) and plasma assisting gas(es) are introduced into an enclosure in which substrates (e.g. fuel injector or hydraulic components or machine tools) are placed. A plasma is initiated by applying a power source to the gas system. The gases are then dissociated and ionized into highly energetic species which react with substrate surface to form desired coatings.

According to an aspect of the invention, the power source may be chosen from the group of microwave power, radio-frequency, electric power including direct and alternating current, high-frequency or other wavelengths of electromagnetic radiation, electron beam, ion beam, or even laser radiation.

According to an aspect of the invention, the substrates (e.g. fuel injector or hydraulic components or machine tools) are placed in between two electrodes (e.g. two flat mesh shaped, or simply two metal plates) inside an enclosure. The precursors, reactive gas(es) and plasma assisting gas(es) are introduced into the enclosure. A high-amperage electric current (either direct current or alternating current) is applied between the two electrodes to cause gas dissociation and ionization to form highly energetic species which then react with substrate surface to form coating.

According to an aspect of the invention, the substrates may be used as one of the two electrodes.

According to an aspect of the invention, two or even more power sources may be used simultaneously.

According to an aspect of the invention, the metal-releasing agent is a titanium-releasing agent, the reactive gases are nitrogen, hydrogen and/or ammonia, the coating is a titanium nitride or titanium carbonitride or composite (titanium nitride and titanium carbide) coating.

According to an aspect of the invention, the metal-releasing agent is $Ti(NR_2)_4$, where R is an organic group such as methyl, ethyl groups, etc.

According to an aspect of the invention, the equipment for gas nitriding, carburizing, or carbonitriding may be used for coating processes by introducing metal-releasing agent.

According to an aspect of the invention, the substrates may be electrically biased to a positive or negative potential to increase ionic or electron bombardment so that adhesion and growth rate may be promoted.

According to an aspect of the invention, a magnetic field may be applied to enhance the deposition process. Particularly at pressures lower than about 10 Torr, electron cyclotron resonance (ECR) may be initiated. The ECR process can be used to promote adhesion, growth rate and uniformity of the deposition.

According to an aspect of the invention, the fuel injector components, hydraulic components, machine tools and other wear parts may be made of metal, alloy, ceramic or composite materials (e.g. steel, tool steel, stainless steel, high speed steel, tungsten carbide-cobalt based ceramics, aluminum oxide, silicon nitride, silicon oxide, tungsten carbide, etc.).

According to the invention, there is provided a low temperature, TiN coating process which features:
  combined heat treating and coating processes: nitriding—
    nitride coatings (TiN, (Ti, Al)N, TiCN, (Ti, Al)CN), etc.
    carborising—DLC.
  Adhesion promotion treatment: surface activation forms a
    unsaturated layer (e.g. nitrogen) which forms a bridge
    between coating and substrate.
  Nanocrystaline renders very smooth surface (see
    FigRoughness).

According to a feature of the invention, a resulting TiN coating exhibits: wear resistant, hardness 2800 Vickers or equivalent to Rc 84, 4 times harder than HSS; low friction co-efficient; stable up to 650-degC. in air; inertness to most chemicals; golden color. Extends tool life, increases speed.

Why low temperatures are used in the Inventive Process

Typical prior art coating processes use high temperatures. PVD works at >500-degC., CVD works at 1000-degC. These high temperatures cause several major problems. (1) softens/anneals heat treated steel; (2) causes distortion; (3) changes dimensions over time.

Cost effectiveness of Inventive Process

Currently, there are only two major processes available, high T PVD and high T CVD. PVD occupies most of the market. Both are very expensive, e.g. coating a ¼" diameter ×2.5" rod cost about $2. In average, post-treatment of these components cost 3 times as much as fabrication cost; TiN costs almost half of the components. It is necessary to bring coating cost down.

Uniqueness of Inventive Process

The following characteristics make the present invention distinctive from the prior arts: low temperature (<350-degc); high growth rate (>6micron/hr.); plasma enhanced CVD; Ti- and N-releasing agents; and unique surface activation.

Advantageous Characteristics of the Inventive Coating(s)

Advantageous properties of the inventive coatings include: lower friction than the prior art coatings; much stronger coating-substrate bonding; drastically lower interface stress; improved uniformity; less expensive core material; shorter cycle time (no loading, evacuation, preheating, cleaning, shorter cooling cycle; high deposition rate); better reproducibility; composite coating capability; lower cost; low investment.

SURFACE ACTIVATION

The process of the present invention has a unique surface activation step. Before deposition, nitrogen plasma is used to activate the surface. Basically, nitrogen-containing gas is introduced into the plasma and is dissociated and ionized to form nitrogen ions which then bombard surface, react and diff-use into the subsurface to form a thin nitride layer. This process is very similar to traditional ion nitriding process except that there is no need to penetrate that deep as they do. Lot of nitriding people need millimeter (mm) deep. The present invention benefits from merely nitriding (activating) the surface. This surface activation process generates a freshly activated surface covered by highly energetic, chemically unsaturated nitrogen atoms with dangling bonds, as depicted here.

This surface activation step results in many benefits. Because this step creates massive, energetic nucleation sites which trap the titanium ions/atoms as soon as they meet them, and therefore significantly promotes deposition rate.

Adhesion: the activated surface forms stronger chemical bonds in the coating-substrate interface.

Smoothness: large nucleation density always produces smoother coating.

More importantly, Nanocrystalline can be formed with large nucleation density. The nanocrystalline always lead to better performance because it is harder, smoother, and so on.

Ti- and N-releasing agent precursor

A unique, efficient Ti- and N-releasing agent system is used as a precursor. For example, Ti(NR2)4 where R=organic groups, e.g. ethyl, propyl, etc. The uniqueness of these molecules include (1) Ti—N bonds are already formed; (2) Organic groups can be easily removed; (3) Ti/N ratio are better controlled; and (4) the dissociation temperature is so low that it forms TiN coating at very low temperature (250-degC.).

APPLICATIONS FOR THE INVENTION

Applications for the present invention may include: wear parts (including actuators, gages, bearing races, valves, pistons, shafts, etc.); cutting tools (WC, high speed steel); knives; pins; cold-forming dies; surgical instruments/tools; punches; cutting and die inserts; injection mold parts; hydraulic components such as valves; sliding components; camshaft, ceramic metal forming tooling, drills, threading tools, extrusion dies, punches, medical wear parts, surgical tools and wear parts, gears, shocks, struts, bearings, pistons, cylinders.

EXAMPLE 1

A LOW TEMPERATURE PLASMA ENHANCED CVD TiN COATING PROCESS FOR FUEL INJECTOR COMPONENTS

Present invention provides a low temperature, high growth rate plasma enhanced chemical vapor deposition (CVD) process for TiN and related coatings on fuel injector components. The deposition process is carried out at low temperatures (<350-degC.) to prevent the bulk substrate properties from being adversely affected. The injector components are treated with a modified "plasma nitriding" process before deposition. Bonding strength (adhesion) between the coating and the injector components can be improved by combining the plasma nitriding processes with the titanium nitride coating processes. TiN-solid lubricant composite coatings are also proposed for fuel injector components. Titanium- and nitrogen-releasing agents are used to improve deposition efficiency. Electric bias potential may also be employed to further enhance adhesion, growth rate and film quality. Other critical components may be treated in the same way using the present invention.

BENEFITS OF THE PRESENT INVENTION

The benefits of the present inventive techniques may be summarized as follows:

1. LOW TEMPERATURE:

The present invention uses titanium- and nitrogen-releasing agents, such as $Ti(NR_2)_4$, where R stands for organic groups. The low bonding energy between N-R makes it easily broken, rendering low temperature deposition feasible.

2. HIGH GROWTH RATE: Generally, the surface activation process generates a great number of nucleation sites, which promote initial growth and eliminates the incubation period observed in most deposition processes. In addition, the unique precursors used supplies not only titanium and nitrogen sources, but also chemical bonding of titanium-nitrogen required for TiN formation, leading high growth rate.

3. LOWER FRICTION: The best way to reduce friction is to produce a smooth surface. The present inventive process has very high nucleation density—a prerequisite for smooth coating. In addition, this process creates nanocrystalline films which generally furnish smooth surfaces and low friction. Moreover, the present inventive processes may produce TiN-solid lubricant based composites, which could significantly reduce friction.

4. STRONGER COATING-SUBSTRATE BONDING: Most PVD and CVD coatings have only physical bonding (van der Waals forces) between coating and substrate. In contrast, the present inventive process has an unique activation step—nitriding. This treatment fabricates a freshly nitrided surface covered by active, valence-unsaturated nitrogen atoms with dangling bonds. It is these unsaturated nitrogen atoms that react with titanium to form titanium nitride films. Since bonding between these active nitrogen atoms and the subsurface is already formed, TiN coating subsequently deposited is therefore chemically bonded to the subsurface. The chemical bonds formed are ten times stronger than physical bonds, leading much stronger coating-substrate interface.

5. LOW INTERFACE STRESS: Differences in thermal expansion characteristics between coating and substrate always bring about stress at interface after the coating deposited at high temperature is cooled down. In extreme cases, the coating may peel off from the substrate. Low temperature used reduces interface stress caused by changing thermal condition.

6. IMPROVED UNIFORMITY: The freshly nitrided surface offers extremely high nucleation density; and additionally the present inventive process uses CVD technique which is omni-directional, the combination leads to very uniform coating.

7. ALTERNATIVE CORE MATERIAL: Wear-resistance is a surface-specific property, therefore it is the surface (rather than core substrate) that plays critical roles in wear related applications, presumably suitable coating has been applied on properly treated substrate with adequate thickness and adhesion. In other words, it is coating that determines how well components work in a large extent. Therefore, lower grade, less expensive materials may be used to replace more costly high speed tool steel materials. Moreover, heat treating processes may be eliminated, at least in part. For example, fuel injector components may be directly nitriding treated and coated with titanium nitride or composites, immediately after mechanical fabrication and finishing. Another possibility is to eliminate some of the heat treating procedures, e.g. quench hardening and/or tempering steps, and directly nitride and coat the parts after mechanical fabrication and finishing.

8. REPRODUCIBILITY: The present inventive process is insensitive to fluctuations of gas flow rates, pressure and temperature, making it more reproducible, easier in quality control.

9. BETTER PERFORMANCE: It is well known that extended exposure at high temperature may significantly affect properties of steel materials and also changes their dimensions, at least in certain extent. The low temperature used in the coating technology of the present invention eliminates problems associated with high temperature processes. In addition, the potential elimination of heat treating procedures preserves core toughness of the substrate material.

10. SHORTER CYCLE TIME: Since the deposition procedure is combined with the nitriding step, loading, evacuation, substrate preheating and cleaning procedures are eliminated. The low temperature used also shortens cooling cycle. Moreover, the high deposition rate cuts deposition time. The total cycle time is therefore significantly reduced.

11. COMPOSITE COATING CAPABILITY: By introducing aluminum precursors, (Ti, Al)N coating may be produced. TiN-solid lubricant films may also be fabricated using this process.

12. LOWER COST: All above advantages will transform into better performance and reduced cost.

13. LOW INVESTMENT: The present inventive technology combines plasma nitriding and titanium nitride coating processes. Most plasma nitriding may be readily modified to carried out the inventive processes. No additional equipment investment is necessary.

Other objects, features and advantages of the invention will become apparent in light of the following description thereof.

DETAILED DESCRIPTION OF THE INVENTION

Because surface plays dominant role in wear-related applications, hardness and friction coefficient of the core material do not affect surface related performance upon applying suitable coating with adequate thickness on substrates. In other words, it is coating that determines how well the component work in a large extent. Therefore, lower grade, less expensive materials may be used to replace costly core materials for most applications. For example, hydraulic valve parts or fuel injector components may be fabricated with less expensive steel material, rather than current high grade steel, if desired coating is properly applied. Moreover, heat treating processes for the core steel prior coating process may also be eliminated, at least in part. Components may be directly coated with desired material, e.g. titanium nitride or composites, immediately after mechanical fabrication and finishing. Another possibility is to eliminate some of the heat treating procedures, e.g. quench hardening and/or tempering steps, and directly surface nitride and coat the parts after mechanical fabrication and finishing.

Since metal-releasing agents can give off metal atoms, ions or active groups very easily, less energy or temperature is required for deposition. For example, most prior art CVD for TiN coatings used TiCl4-N2-H2 system. Deposition were carried out at high temperature, some goes up to over 1000° C. Even at this high temperature, chlorine was still incorporated into the film. This is a clear evidence that some titanium-chlorine bonds remain intact even at this high temperature. In addition, hydrogen chloride by-product, causes corrosion to the system and hazard to the environment.

The present invention uses metal-releasing agent as a precursor, e.g. Ti(NR2)4 where R represents organic groups such as methyl, ethyl, and other alkyl groups. These compounds have two advantages: (1) titanium-nitrogen bonds are already formed; (2) the organic groups may be easily removed. The combination of these two characteristics drives down deposition temperature drastically to about 250-degC. As a matter of fact, Ti(NR2)4 gives not only titanium and nitrogen sources, but also titanium-nitrogen bonds as well.

Moreover, low temperature and organometallic precursors used in the present invention may form some amount of titanium carbonitride, which provides better mechanical properties. The present invention uses high energy plasmas which makes dissociation much more efficient than thermal process as disclosed in prior art. In addition, plasma process generates highly energetic ions and electrons, leading faster deposition and stronger coating-substrate bonding.

The present invention combines surface heat treating (or surface hardening) process and coating process together, (e.g. nitriding and nitride coating are combined; carburizing and carbide as well as carbon coatings combined; boronizing and boride coating; siliconizing and silicide coating, etc.) The surface heat treating step fabricates an active surface which provides massive nucleation sites so that the film can grow on the freshly activated surface. The treated surface provides the following advantages:

(1) massive, energetic nucleation sites are necessary for high growth rate;

(2) active surface promotes formation of stronger chemical bonds in the coating-substrate interface;

(3) larger nucleation density makes coating smoother; and (4) the high deposition and nucleation rates favor formation of nanoscale crystals which offer improved mechanical properties, such as high hardness, low friction coefficient.

A preferred example is to combine nitriding of steel surface and titanium nitride coating processes. The plasma nitriding step generates a freshly activated steel surface covered by highly energetic, chemically unsaturated nitrogen atoms with dangling bonds. The titanium atoms or titanium-containing groups can be immediately "trapped", forming titanium nitride. Since the surface nitrogen atoms are bonded to the subsurface of the steel substrate, the titanium nitride coating formed is more strongly bonded to the steel substrate. In the aforementioned manner, other ceramic coatings (such as nitrides, borides, carbides, oxides, silicides, sulfides, carbon and hydrogenated carbon) may also be rapidly deposited. The corresponding plasma treated surfaces result in superior adhesion.

The aforementioned processes also apply to complex or composite coatings, e.g. (titanium, aluminum) nitride, titanium carbon nitride, aluminum oxide, silicon nitride, carbon, hydrogenated carbon coatings.

Figure 1:
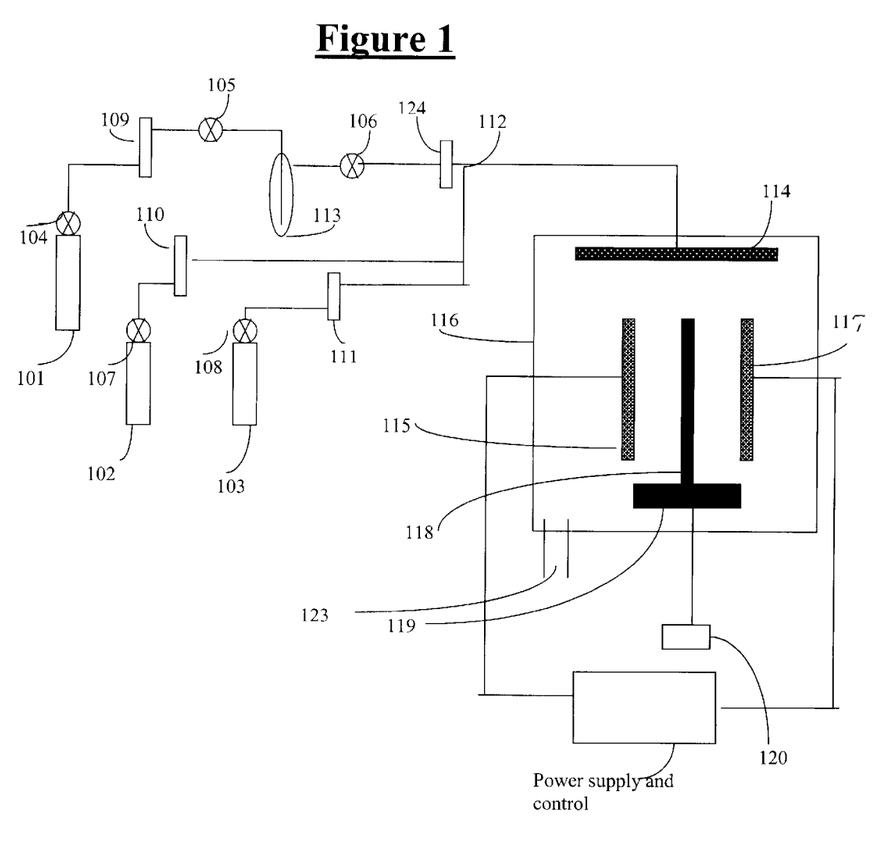
FIG. 1 is a schematic diagram of a plasma system for performing the processes of the present invention.

FIG. 1 is a schematic diagram of a plasma system for performing the processes of the present invention. For nitriding treatment and titanium nitride or titanium carbonitride coating processes, 101, 102 and 103 are gas cylinders for nitrogen, hydrogen and ammonia respectively. Another gas line may be added (not shown) to feed hydrocarbon gas if it is necessary. 104, 105, 106, 107 and 108 are flow control valves. 109, 110, 111 and 124 are mass flow controllers which control and measure flow rates. Although the film quality is relatively insensitive to gas flow rates for CVD titanium nitride coating, ammonia to hydrocarbon ratio does play a role in controlling C/N ratio in the titanium carbonitride films. At 112, all gases are mixed together (they may be introduced into the enclosure separately too). 113 is a temperature controlled bubbler which contains tetrakis (dimethylamido) titanium. Because the vapor pressure of tetrakis(dimethylamido) titanium is a function of temperature, quantity of tetrakis(dimethylamido) titanium introduced into the system may be controlled by adjusting temperature of the bubbler.

If (titanium, aluminum) nitride is desired, another bubbler may be added (preferably) to introduce aluminum source, e.g. $AlR_3$ where R stands for organic groups (such as methyl, ethyl, iso-propyl, t-butyl, and so on). Other processes remain the same.

The element 114 is a gas ring which distributes gas uniformly to the reaction region. The elements 115 and 117 are two electrodes, they are preferably flat and conductive solid plates or meshes. The spacing between two electrodes are adjustable (such as by micrometer mechanism, not shown) for optimizing process parameters. The element 118 is a substrate which sits in the middle of the two electrodes, however, it is in the scope of this invention that multiple substrates may be handled. The element 119 is the substrate holder or fixture. Preferably, the holder can manipulate (translate and rotate) substrate to improve coating uniformity. For industrial production, the holder may be designed to hold more than one components. The element 120 is a temperature controller which measures temperature of the substrate. A heater is incorporated into the holder (not shown in the drawing), controlled by the temperature controller so that the substrate may be heated if it is necessary. In addition, an electric bias can be applied to the substrate through the thermocouple feedthrough. It is in the scope of this invention that one may connect two electrodes to the same potential and use the substrate as the other electrode. It is also conceivable that a tubular electrode may be used and the substrate may be placed in the center of the tube, as the other electrode. The enclosure walls may also be used as one of the electrodes and the substrate as the other electrode. The element 123 is exhaust which may include pump, controller, filter and venting systems. The power source may be direct current, alternating current, high frequency, or the like. The power may be continuous or in pulsed modes. The pulsed mode is preferable if substrate is overheated.

The following is a preferred embodiment for performing titanium nitride and titanium carbon nitride coating on fuel injector components with the present invention. The injector components are loaded onto the substrate holder. The plasma surface nitriding cycle is carried out first. Since the nitriding process is mainly for surface activation to promote nucleation, growth and adhesion, the cycle time may be greatly reduced to a few minutes to a hour. In this cycle, ammonia or nitrogen-containing gases are introduced with dilution gas into the enclosure to total pressure of preferably about 1 Torr to 50 Torr range. Plasma assisting gas such as argon, helium, etc. may be added to help initiate and stabilize the plasma. Once the plasma is initiated, electric current is preferably regulated in the range of about 10 to 500 amperes, depending on the size of the enclosure. The discharge voltage may also be regulated. Preferably, the components may be negatively biased relative to the electric potential of the plasma. The bias may promote surface activation by increasing kinetic energy of the active species.

After the surface activation cycle (preferably keep plasma going), nitrogen, hydrogen and tetrakis (dimethylamido) titanium are introduced into the plasma. Additional carbon may be added by supplying hydrocarbon for titanium carbonitride deposition. The flow rate of tetrakis (dimethylamido) titanium is regulated by adjusting temperature of the bubbler and flow rate of the carrier gas—usually nitrogen or argon. For example, at 100-degC., the vapor pressure of tetrakis (dimethylamido) titanium ($P_{Ti}$) is about 9 Torr. If the bubbler temperature is kept constant, the flow rate of the titanium precursor ($f_{Ti}$) can be regulated by controlling the flow rate of carrier gas ($f_{carrier}$). The following equation is used to calculate $f_{Ti}$:

$$f_{Ti}=(f_{carrier} \times P_{Ti})/(P_{Total}-P_{Ti})$$

where $PTotal=P_{Ti}+P_{carrier}$ is the total gas pressure of titanium precursor and carrier gas, measured at the bubbler output. Flow ratio of the ammonia/nitrogen and titanium is preferably controlled in the range of 0.5 to 10. The total pressure in the enclosure during deposition is preferably regulated in the range between 1 to 100 Torr. At the deposition stage, amperage and voltage may also be regulated to different values. It is also preferred to rotate and translate the substrate during the processing.

Upon minimum modification of the substrate holder, different substrates such as hydraulic components, machine tools and other wear parts may be coated. Other coatings may also be applied based on the above process. For other substrate materials or components, different holder or fixture may be adopted. If different coatings are desired, suitable metal-releasing agents should be employed as precursor materials. For example, tri-isobutyl aluminum may be added into the above disclosed process to fabricate (Ti, Al)N coatings.

Although the above example is directly for coating fuel injector components with titanium nitride, titanium carbonitride or (Ti, Al)N materials, the methods, processes are not intended to be limited into this application, or steel materials. It is in the scope of this invention that the processes disclosed may also be used for other wear-related applications, on other substrate materials.

Figure 2:
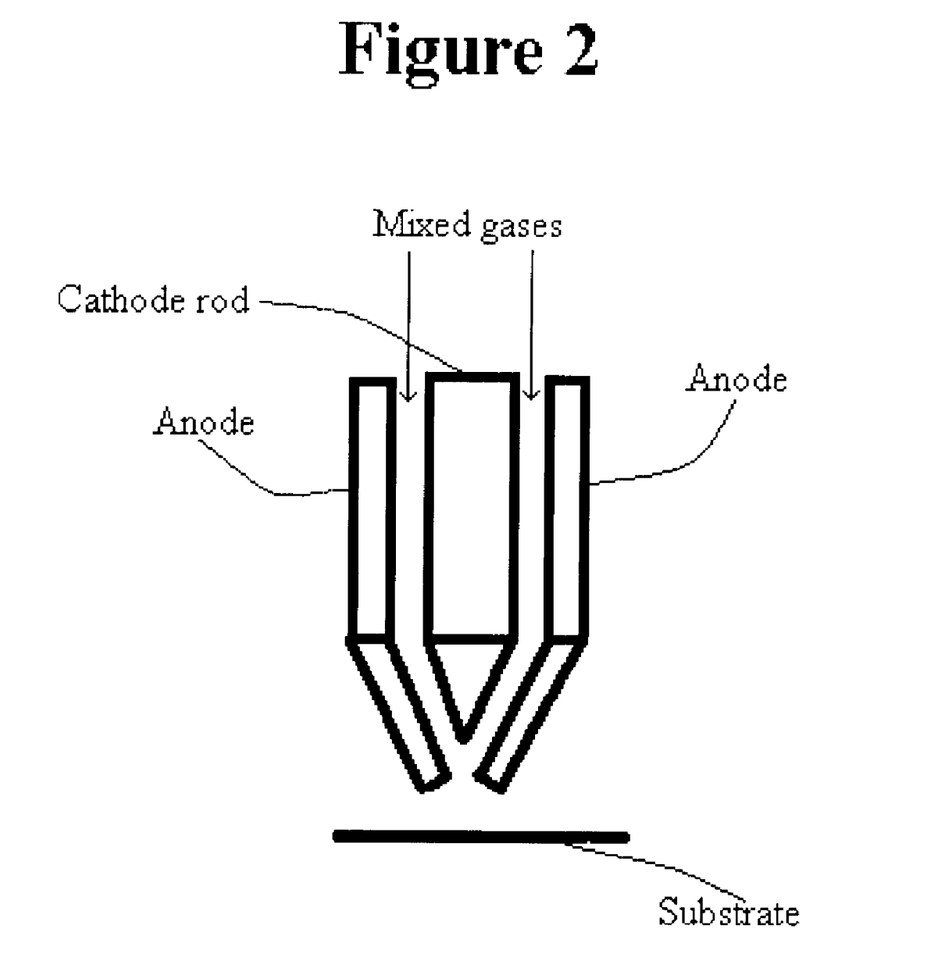
FIG. 2 is another schematic diagram of a system for performing the processes of the present invention.

FIG. 2 is another schematic diagram of a system for performing the processes of the present invention. After controlled flow and mixing of gases, such as nitrogen, ammonia, metal-releasing agent, etc., the mixed gases are injected into the plasma region. Upon dissociation and ionization in the plasma, the precursors are introduced onto the substrate surface to form coatings. Preferably, the entire setup in the drawing may be placed in an enclosure, such as a chamber so that pressure and environment can be better controlled. Although FIG. 2 uses a cylindrical anode and a cathode rod, planar electrode configuration is also operable for this purpose.

Figure 3:
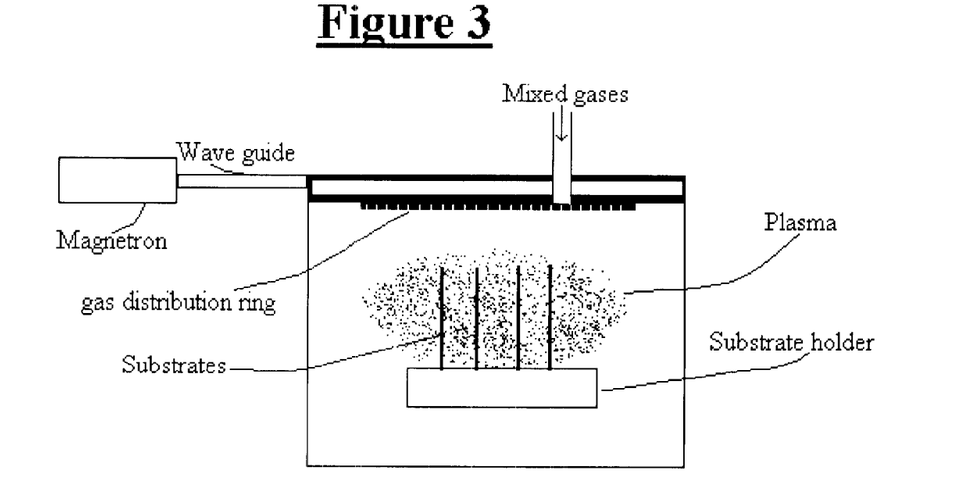
FIG. 3 is another schematic diagram of a system for performing the processes of the invention.

FIG. 3 is another schematic diagram of a system for performing the processes of the invention. Again after controlled flow and mixing of gases, the gas mixture is injected into a gas distribution ring which uniformly distribute gases into the plasma region. Upon dissociation, ionization and activation with the microwave power source (magnetron and wave guide, as shown), they react with substrate (four are shown as an illustration in the drawing) surface to form desired coating. A heater or cooling unit (not shown in the drawing) may be incorporated into the substrate holder to regulate substrate temperature. A magnetic field (not shown) may be applied to the plasma to enhance the plasma activation process through so called electron cyclotron resonance (ECR) mechanisms. It is especially advantageous to use ECR at low pressure (<10 Torr) because ECR processes enhance adhesion, growth rate, smoothness and uniformity of the coatings. The detailed coating steps may be found in the description of FIG. 1. Briefly, surface activation is carried out first, followed by coating process.

It should also be noted that when oxides are intended, alkoxide may be used. For example, aluminum alkoxide (such as aluminum isopropoxide, aluminum methoxide, aluminum nickel isopropoxide ($Ni[Al(OC_3H_7)_4]_2$, etc.) may be used for aluminum oxide and its composite (e.g. alunina-nickel oxide) deposition, silicon alkoxide for silicon oxide, titanium alkoxide (e.g. $Ti(C_2H_5O)_4$) for titanium oxide, and so on. Controlled mixtures of two or more alkoxides can be used to form composites with controlled composition. Oxidizing agents which can be used for oxide deposition may include carbon dioxide, air, oxygen, water vapor, ozone, hydrogen peroxide, carbon monoxide and the like.

Figure 4:
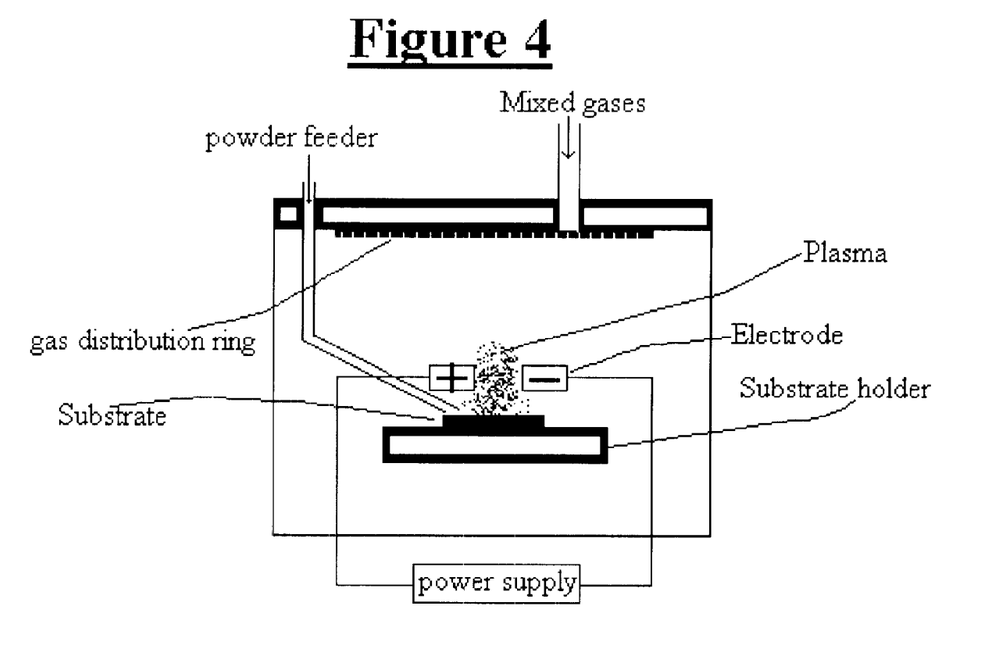
FIG. 4 is another schematic diagram of a system for performing the processes of the invention.

FIG. 4 is another schematic diagram of a system for performing the processes of the invention. In this system, upon precursor gases are dissociated, ionized and activated in the plasma, the energetic species produced intersect with powder material (which is transported into the system by a powder feeder), they then deposit onto the substrate, as shown. The powder material may be polymers, preferably polytetrafluoroethylene (PTFE, DuPont Teflon), polyphenylene, polyethelene, polyurethane, polycarbonate, ABS, polyimides, polyamides, polystyrene, poly-perfluoroalkoxy (PFA), poly-ethylene tetrafluoroethelene (ETFE), Fluorinated ethylene propylene (FEP), fluoropolymers and the like. In this manner, ceramic-polymer composites are formed. Metal, ceramic powders may also be fed through this powder feeder.

In a similar manner, composite materials may be applied as coatings. For example, upon introducing tungsten-containing material, such as tungsten-alkyl organic compounds, and sulfur-containing materials, (e.g. $H_2S$), tungsten disulfide may be formed in composites. In this manner, solid lubricants may be easily incorporated into hard ceramic coatings. Other lubricants that may be incorporated by this method include molybdenum disulfide, tungsten disulfide, boron nitride, carbon, hydrogenated carbon, and so on.

It is also conceivable that the lubricant materials may be applied to the coating after the coating process. For example, lubricant powder material may be impinged or infused into coating surfaces.

Figure 5:
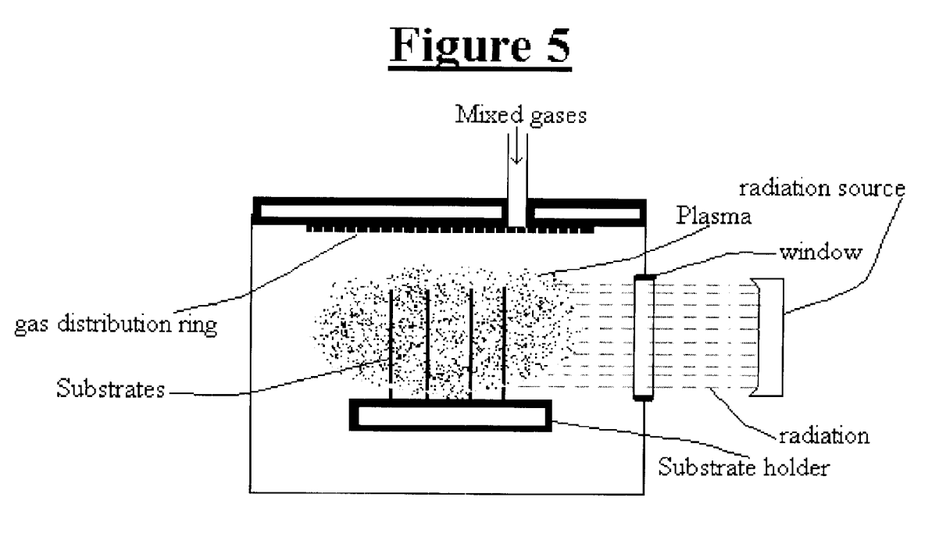
FIG. 5 is another schematic diagram of a system for performing the processes of the invention.

FIG. 5 is another schematic diagram of a system for performing the processes of the invention. The mixed gases are introduced from the gas distribution ring into the plasma (power source is not shown in the illustration). The deposition occurs on the substrate surfaces which are immersed into the plasma. A major advantage of this system is that a radiation source is used to radiate the deposition region. The electromagnetic radiation may be used to promote ionization, activation, growth rate, bonding. The radiation may be in the wavelength of ultraviolet (UV) or infrared (IR) region, depending on the gases and substrates used. For example, ammonia has high absorbance in IR region, IR radiation may be used. Benzene vapor has a strong absorption in UV region, especially at wavelength of 255 nm, an UV radiation may be used. Particularly a source having emission at or close to that wavelength is the most efficient source. UV and IR lamps, focused beams such as lasers may also be used as radiation sources to enhance deposition process.

The present invention uses a titanium-and nitrogen-releasing agent system which gives off active precursor species for TiN deposition very effectively. One proven class of such agents are $Ti(NR_2)_4$ where R represents organic groups such as ethyl, propyl and other alkyl groups. These compounds have two advantages: (1) titanium-nitrogen bonds are already formed; and (2) the organic groups may be easily removed. The combination of these two characteristics drives deposition temperature drastically to about 250-degC., also guarantees Ti/N ratio of unity, leading more controllable film quality.

Moreover, low temperature and organometallic precursors used in the present invention favors formation of titanium carbonitride in certain degree, which provides even better mechanical properties. The present inventive process uses high energy plasmas which makes dissociation much more efficient than thermal process of the prior art, leading faster deposition and stronger coating-substrate bonding.

The present invention combines plasma nitriding and titanium nitride coating into a single step process. This combination provides the following unique advantages. In the plasma nitriding process, nitrogen-containing gas (nitrogen, ammonia) is dissociated and ionized. The nitrogen ions formed bombard metal surface, react and diffuse into the subsurface to form a nitride layer. Formation of metal (iron, chromium, etc.) nitrides are so favorable thermodynamically that the nitride layer may penetrate as deep as 1 mm under metal surface. The nitriding condition may vary widely in terms of pressure, temperature, power sources and precursors. On surface, this step generates a freshly activated steel surface covered by highly energetic, chemically unsaturated nitrogen atoms with dangling bonds. The titanium atoms or titanium-containing groups can be immediately "trapped", forming titanium nitride. Since the surface nitrogen atoms are bonded to the subsurface of the steel substrate, the titanium nitride coating formed is more strongly bonded to the steel substrate. All in all, the following advantages are obvious: (1) massive, energetic nucleation sites fabricated in the plasma nitriding step significantly promotes deposition rate; (2) active surface improves formation of stronger chemical bonds in the coating-substrate interface; (3) larger nucleation density makes coating smoother; and (4) the high deposition and nucleation rates favor formation of nanoscale crystals which offer improved mechanical properties, such as higher hardness, lower friction coefficient and smoother surface.

In a similar manner, composite materials may be applied as coatings. For example, (titanium, aluminum) nitride probably performs better for wear-related applications. By introducing aluminum-releasing agent, e.g. AlR3 where R stands for organic alkyl groups (such as methyl, ethyl, iso-propyl, t-butyl, and so on), (Ti, Al)N films can be coated without significantly modifying equipment or process. Upon introducing tungsten-containing material, such as tungsten-alkyl organic compounds, and sulfur-containing materials, (e.g. H2S), tungsten disulfide may be formed in composites. In this manner, solid lubricants may be easily incorporated into TiN coatings. Other lubricants that may be incorporated by this method may include molybdenum disulfide, tungsten disulfide, boron nitride, carbon, hydrogenated carbon, polymers, and so on.

Electric bias may be applied to the substrate (injector component) or even connected to one of the electrodes (e.g. negative) during deposition. Since the bias potential increases kinetic energy of the selective ions, e.g. titanium ions, it should promote adhesion and increase growth rate.

EXPERIMENTAL PROCEDURE

The following summarizes the experiment steps of a preferred procedure for performing titanium nitride and titanium carbon nitride coating with the process of the present invention. Load components into the nitriding chamber (the components may be loaded onto the substrate holder/fixture);

Preheating;

Plasma surface activation;

Coating deposition;

Cooling; and

Venting and unloading.

Although the invention has been illustrated and described in detail in the drawings and foregoing description, the same is to be considered as illustrative and not restrictive in character—it being understood that only preferred embodiments/examples have been shown and described. And that all changes and modifications that come within the spirit of the invention are desired to be protected. For example, substrate rotation and translation mechanism may be employed in all systems; gases may be introduced individually instead of a mixture; substrate holder may handle multiple substrates/components; a powder feeder may be attached in all systems so that a solid material may be introduced into the coating process; gas lines may be heated to prevent vapor condensation; the precursors and other gases may be plasma sprayed onto articles to be coated; a radiation source may be applied to all systems; other plasma power sources may be used, including radio frequency, electron beam, ion beam, lasers, x-rays or combination of more than one power sources, and so on.

COMMENTS REGARDING THE PRIOR ART

The present invention provides "an improved technique for fabricating a hard, wear-resistant ceramic coating on metal, alloy and ceramic surfaces without affecting bulk metal properties, especially core toughness, adversely."

The present invention makes possible "a high growth rate (>1 micron/hour, preferably about micron/hour) ceramic film deposition and strong coating—substrate bonding."

Coatings which can be formed by the present invention include: nitrides, oxides, carbides, boride ceramics, silicide ceramics, complex/composite ceramics, carbon, hydrogenated carbon materials, fluorides and sulfides, and their composites, polymer-containing composite materials.

The coating technique of the invention is low temperature (<250-degC.), and has a high growth rate (>1 micron/hour, preferably about 10 micron/hour) by using metal-releasing agents as precursors.

The substrates for this invention include metals, alloys, and ceramics.

The technique of the present invention results in an activation layer of the present invention which is part of the substrate, and is also part of the coating. It is part of both! It is only a surface layer thick (an atomic layer thick), having essentially no thickness. It chemically bonds the substrate and the coating together, forming a chemical "bridge" between coating and substrate.

The present invention provides a technique for fabricating wear resistant and tribological coatings on fuel injector, hydraulic valve components, machine tools (e.g. cutting inserts, drills, punches, dies, saws, molds, pins, knifes, cutters, etc.) at temperatures lower than 500-degC., preferably lower than 250-degC.

The present invention reduces surface friction and increases wear-resistance.

The present invention provides improved bonding between the coating and the substrate by combining surface heat treating processes . . . . with coating processes. For example:

freshly nitrided surface has a better bonding with nitride coatings and the surface activation layer (a layer of nitrogen which saturates substrate surface) bonds substrate and the nitride coating together chemically.

freshly carburized surface has a better bonding with carbon-containing coatings because the surface activation layer (a layer of carbon on the substrate) bonds carbide coating to the substrate chemically.

freshly siliconised surface has a better bonding with silicon-containing coatings because the surface activation layer (a layer of silicon covering substrate surface) can bond substrate and the silicon-containing coating chemically.

freshly boronised surface has a better bonding with boron-containing coating because the surface activation layer (a layer of boron covering the substrate) may form chemical bonds with the boron-containing coating.

The present invention provides a technique for fabricating composite coatings of hard ceramic material and above lubricant materials with low friction coefficients on fuel injector components, hydraulic components and machine tools."

The present invention provides "a technique for fabricating nanoscale coatings with better wear-resistant properties.

The present invention provides good bonding strength or adhesion as a result of its unique surface activation process. The surface activation step of the present invention creates an atomic surface layer, essentially dimensionless (having no thickness). For example, for nitride coating, a nitrogen saturated surface is formed and for carbide coating, a carbon saturated surface is formed. The surface atoms form chemical bonds with the substrate and meanwhile possess unsaturated dangling bonds which then bond to the coating layer during the coating process. This activated surface serves as a bonding layer (nucleation sites) between substrate and the coating deposited later on. The uniqueness is that the surface atoms form chemical bonds between both the substrate and the coating.

The aforementioned U.S. Pat. No. 5,707,705 ("Nelson") relates generally to magnetic-recording disks, and relates more particularly to a titanium or titanium alloy substrate for application of magnetic-recording media. There is no surface activation. Nelson's surface hardening treatment is different from the surface activation of the present invention. In Nelson's applications, adhesion is not as important as for contemplated applications for the present invention. Nelson discloses cleaning the surface "by sputter etching and then hardened" before applying coating. Nelson "modified to the depth of several micrometers (as much as 100 micron)" by this hardening treatment. The treatment forms "in the titanium or titanium alloy to form fine-grain precipitates of interstitial nitrogen-containing, carbon-containing, or nitrogen- and carbon-containing alloys, and of nitride, carbide, or carbonitride phases". Nelson's hardened layers are self-saturated, lacking unsaturated dangling bonds to form chemical bonds with coating layer. Nelson teaches away from the present invention. Additionally:

1. Nelson's patent teaches how to prepare substrate surfaces of titanium or its alloy based magnetic-recording disks for applying coating of magnetic materials, as clearly stated to provide "a flat, hard substrate for the deposition of magnetic recording materials." Nelson simply teaches a substrate preparation method, not to finished surface as in the present invention.

2. Nelson's substrates are limited to "very flat and smooth" disks. The present inventive method covers complex shapes.

3. Nelson's method is high temperature, as he stated "at temperatures of 350-degC. to 850 degC. This is precisely contrary to the low temperature definition of the present invention.

4. Nelson has a distinctive step for surface oxide cleaning as stated "the oxides on the disk substrate surfaces are sputter-etched away."

5. Nelson teaches that "furthermore, this air gas discharge provides an extremely effective method for efficiently heating the disk substrates by means of the heat input delivered not only by the low-voltage bombarding ions but also by the surface recombination of energetic excited neutral atoms to form molecules." This limitation is overcome by the present invention wherein the heating step is avoided to prevent most heat-treated materials from distortion.

6. Nelson teaches "thermionic hot-tungsten-filament cathodes" is an advantageous technique. Such a heating process would be detrimental to the heat-treated materials of the present invention.

7. Nelson's hard coating is applied by "evaporative reactive ion plating or reactive sputtering." The present invention utilizes low temperature plasma enhanced CVD.

What is claimed is:

1. Method of fabricating a CVD ceramic coating on metal, alloy and ceramic articles comprising:

activating a surface of an article by using a plasma surface hardening technique; and CVD depositing, at less than 350 degrees Celsius, a ceramic coating on said freshly activated surface;

wherein:

the ceramic coating is a solid lubricant-containing coating and the solid lubricant is selected from the group consisting of tungsten disulfide, molybdenum disulfide, boron nitride, carbon, hydrogenated carbon and polymeric materials selected from the group consisting of polytetrafluoroethylene, polyphenylene, polyethylene, polyurethane, polycarbonate, ABS, polyimides, polyamides, polystyrene, poly-perfluoroalkoxy (PFA), polyethylene tetrafluoroethelene (ETFE), Fluorinated ethylene propylene (FEP), and fluoropolymers.

2. Method, according to claim 1, wherein:

the article is selected from the group consisting of steel based article, fuel injector component, hydraulic valve component, machine tool insert, drill, die, punch, mill, saw, mold, pin, knife, and cutters.

3. Method, according to claim 1, wherein:

the plasma surface hardening technique is selected from the group consisting of nitriding, carburizing, carbonitriding, nitrocarburizing, boronising, siliconizing, and sulfidizing.

4. Method, according to claim 1, further comprising:

reducing stress at the ceramic coating-substrate interface by lowering deposition temperature using a metal-releasing agent.

5. Method, according to claim 4, wherein:

the metal-releasing agent is $Ti(NR_2)_4$, where R is an organic group.

6. Method, according to claim 1, further comprising:

using electromagnetic radiation, selected from the group consisting of ultraviolet rays and infrared rays, to radiate the substrate surface during at least the CVD depositing step so as to promote ionization, activation, growth rate, bonding.

7. Method, according to claim 1, wherein:

the plasma surface hardening technique employs a power source selected from the group consisting of microwave power, radio-frequency, direct current electric power, alternating current electric power, electromagnetic radiation, electron beam, ion beam, and laser radiation.

8. Method, according to claim 1, further comprising:

placing the article between two electrodes; and applying an electric current between the two electrodes to cause gas dissociation and ionization to form energetic species which then react with surface to form the coating.

9. Method, according to claim 1, further comprising:

applying a magnetic field to enhance the deposition process.

* * * * *